United States Patent
Itoigawa et al.

[11] Patent Number: 5,946,549
[45] Date of Patent: Aug. 31, 1999

[54] METHOD FOR MANUFACTURING SENSOR USING SEMICONDUCTOR

[75] Inventors: Koichi Itoigawa; Hitoshi Iwata, both of Aichi-ken, Japan

[73] Assignee: Kabushiki Kaisha Tokai Rika Denki Seisakusho, Japan

[21] Appl. No.: 08/864,152

[22] Filed: May 28, 1997

[30] Foreign Application Priority Data

May 29, 1996 [JP] Japan .................................. 8-135395

[51] Int. Cl.$^6$ ...................................................... H01L 21/00
[52] U.S. Cl. .......................... 438/53; 438/52; 73/514.21; 257/419
[58] Field of Search ..................... 438/53, 52, FOR 412; 148/DIG. 159; 73/514.21, 514.32, 777; 257/418, 419, 417, 254

[56] References Cited

U.S. PATENT DOCUMENTS

| | | | |
|---|---|---|---|
| 4,463,336 | 7/1984 | Black et al. | 257/419 |
| 4,975,390 | 12/1990 | Fujii et al. | 148/DIG. 135 |
| 5,129,982 | 7/1992 | Wang et al. | 438/924 |
| 5,199,298 | 4/1993 | Ng et al. | 73/147 |
| 5,719,069 | 2/1998 | Sparks | 148/DIG. 135 |
| 5,725,729 | 3/1998 | Greiff | 438/52 |
| 5,744,725 | 4/1998 | Chen et al. | 73/724 |
| 5,804,457 | 9/1998 | Benz et al. | 148/DIG. 159 |

FOREIGN PATENT DOCUMENTS

| | | | |
|---|---|---|---|
| 5-114744 | 5/1993 | Japan | 438/FOR 412 |
| 7-58347 | 3/1995 | Japan | 438/FOR 412 |

*Primary Examiner*—Michael Trinh
*Attorney, Agent, or Firm*—Trask, Britt & Rossa

[57] ABSTRACT

A method for manufacturing sensors using semiconductors that is optimal for obtaining compact sensors is described. The method includes the steps of (a) applying an n-type silicon layer to the upper surface of a silicon substrate, (b) applying a p-type silicon layer on either the upper surface of the n-type silicon layer or the upper surface of a base, (c) removing part of the p-type silicon layer by electrochemical etching, (d) joining the base with the p-type silicon layer applied to the n-type silicon layer or joining the n-type silicon layer with the p-type silicon layer applied to the base, (e) removing the silicon substrate and exposing the upper surface of the n-type silicon layer, and (f) forming a strain gage in a section of the upper surface of the silicon substrate so that a portion of the n-type silicon layer facing the upper surface of the base functions as a diaphragm.

17 Claims, 8 Drawing Sheets

METHOD FOR MANUFACTURING SENSOR USING SEMICONDUCTOR

BACKGROUND OF THE INVENTION

1. Field of the Invention

The present invention relates to methods for manufacturing sensors using semiconductors, and more particularly, to methods for manufacturing sensors that employ semiconductors for pressure sensors, acceleration sensors, or the like.

2. Description of the Related Art

Figure 1:
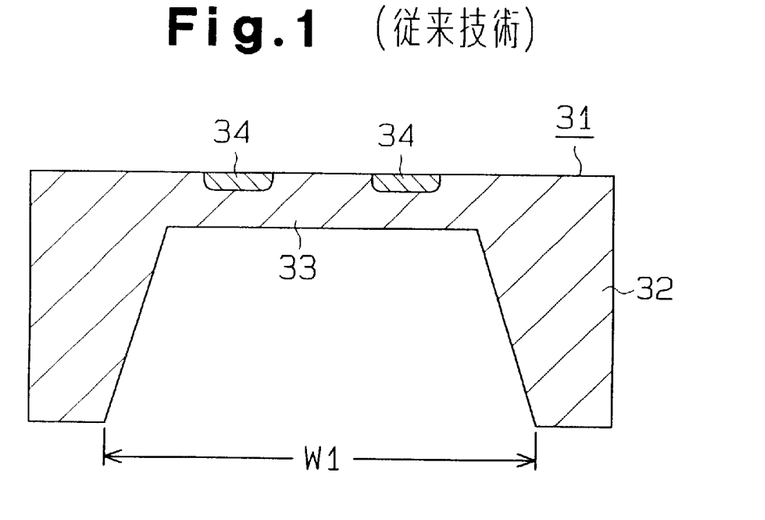
FIG. 1 is a cross-sectional view showing a first example of a prior art pressure sensor.

As shown in FIG. 1, a pressure sensor 31 has a diaphragm 33, which serves as a pressure receiving surface (detecting portion). The diaphragm 33 is employed to produce displacement or distortion that is proportional to pressure. The diaphragm 33 is formed using the crystal anisotropic etching method to partially etch a silicone substrate 32 at one side, which has a (100) plane. The diaphragm 33 has a surface on which a plurality of dispersion strain gauges 34 are arranged. The diaphragm 33 is bent by pressure. The dispersion strain gauges 34 are constructed so that their resistance values change in accordance with the bending of the diaphragm 33. The detection of changes in the resistance values of the dispersion strain gauges enables detection of the pressure.

To manufacture the pressure sensor 31 shown in FIG. 1, a silicon substrate 32 (wafer) having a thickness of 200 to 300 microns is normally used. It is preferable that the diaphragm 33 be wide and thin so as to enable the pressure sensor 31 to have a high detecting sensitivity. However, to form such a diaphragm 33, it is necessary that the substrate be provided with an opening having a relatively large dimension W1 for the following reasons. To carry out anisotropic etching on a thick silicone substrate 31, an etching hole having an opening angle corresponding to the (111) plane must be provided. The opening angle necessitates an opening having a relatively large dimension. This hinders the production of a compact pressure sensor 31.

To produce a dispersion strain gage 34, the resistance of which changes dramatically, the silicon substrate 32 having n-type conductivity and the dispersion strain gage 34 having p-type conductivity are used. In this case, the etching time affects control of the thickness of the diaphragm 33. Thus, it is difficult to form a diaphragm 33 having uniform thickness.

Figure 2:
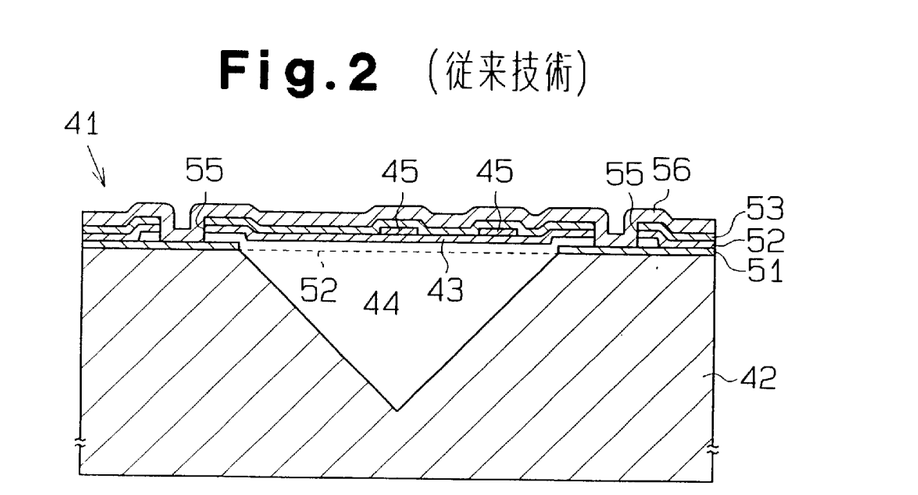
FIG. 2 is a cross-sectional view showing a second example of a prior art pressure sensor.
Figure 3A:
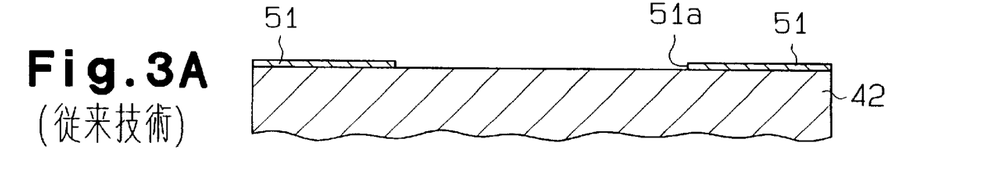
FIGS. 3A–3D are cross-sectional views showing the manufacturing steps of the pressure sensor of FIG. 2.
Figure 3B:
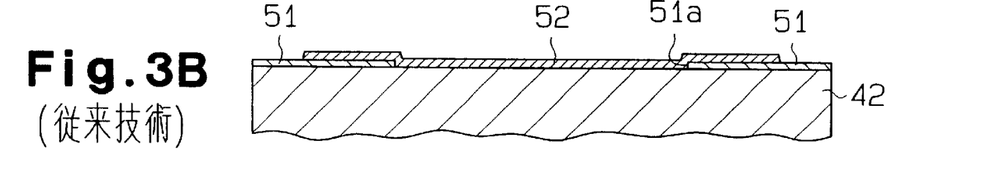
Figure 3C:
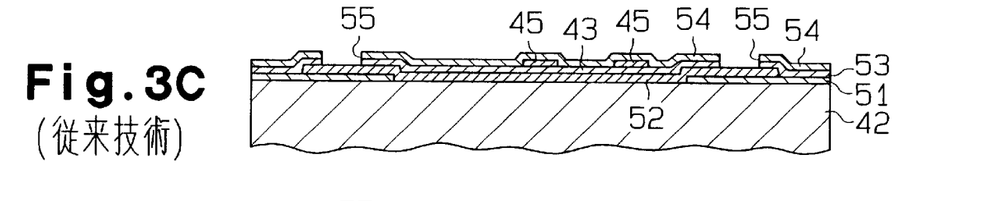
Figure 3D:
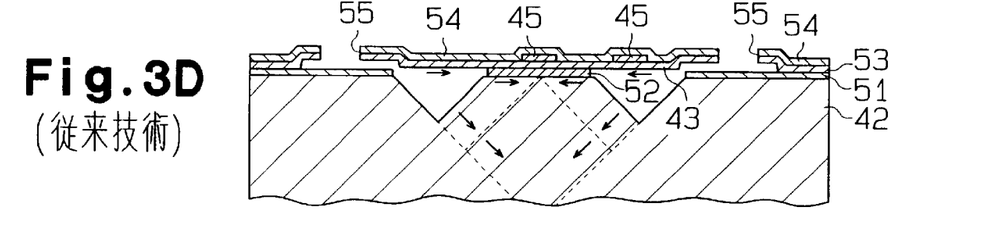

As shown in FIG. 2, another type of pressure sensor 41 has a diaphragm 43, which is formed on a silicon substrate 42. The diaphragm 43 is made of a silicon nitride film ($Si_3N_4$) and has a square shape. The silicon substrate 42 has a pyramid-like well that is located right beneath the diaphragm 43 and formed by performing anisotropic etching. The well and the diaphragm 43 define a vacuum reference pressure chamber 44. On the opposite side of the reference pressure chamber 44, the diaphragm 43 has a surface on which a plurality of strain gages 43 are arranged. The strain gages 45 are formed by the deposition of polysilicon. The diaphragm 43 bends in accordance with the difference between the external pressure and the pressure of the reference pressure chamber 44. Since the reference pressure chamber 44 is under vacuum pressure, the pressure sensor 44 can detect absolute pressure.

The pressure sensor 41 is produced in accordance with the following manufacturing process.

Step 1 (refer to FIG. 3A): A first nitride film 51 made of $Si_3N_4$ is applied to the surface of the silicon substrate 42. A portion of the first nitride film is removed to form a square window 51a.

Step 2 (refer to FIG. 3B): An etching channel 52 made of polycrystalline silicon is applied so as to encompass the window 51a.

Step 3 (refer to FIG. 3C): A second nitride film 53 made of $Si_3N_4$ is applied to the entire surface of the etching channel 52 and the first nitride film 51. Strain gages 45 made of polycrystalline silicon are formed on part of the second nitride film 53 that correspond to the formation area of the diaphragm 43. To cover the strain gages 45, a third nitride film 54 made of $Si_3N_4$ is applied to the entire surface of the second nitride film 53. At the peripheral region of the formation region of the diaphragm 43, etching bores 55 are formed extending through the second and third nitride films 52, 53.

Step 4 (refer to FIG. 3D): An anisotropic etching solution is poured into the bores 55 to perform undercut etching (anisotropic etching) of the silicon substrate 42. The etching channel 52 is gradually removed by the etching solution and a well is gradually formed in the surface of the silicon substrate 41. Etching is completed when the entire etching channel 52 is removed and the pyramid-like well is formed in the silicon substrate 42. The well has four sidewalls that has the (111) plane.

Step 5 (refer to FIG. 2): The plasma chemical vapor-deposited (CVD) method is used to seal the bores 55. This applies a fourth nitride film 56 made of $Si_3N_4$ on the entire surface of the device. The pressure sensor 41 having a vacuum reference pressure chamber 44 is produced in this manner.

The pressure sensor 41 of FIG. 2 is more compact than the pressure sensor 31 of FIG. 1 since the reference pressure chambers 44 are pyramid-like. However, it is difficult to securely seal the bores 55 so as to maintain the reference pressure chambers 44 in a vacuum state.

Figure 4:
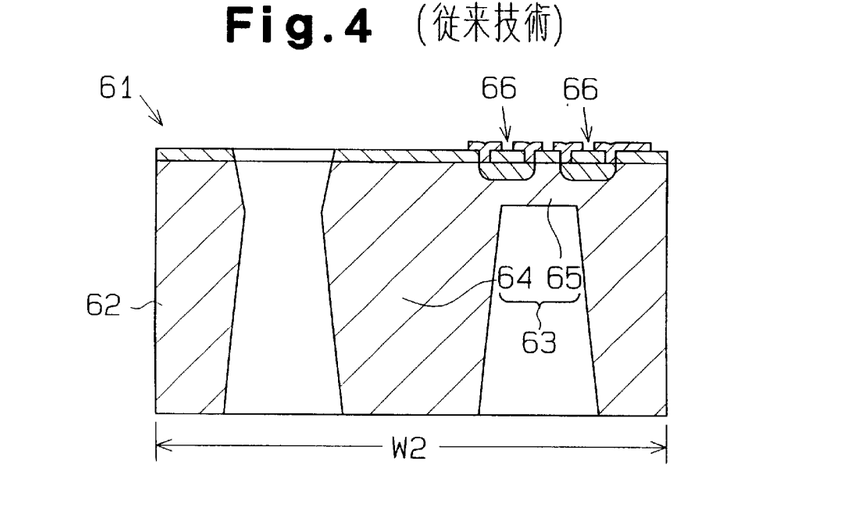
FIG. 4 is a cross-sectional view of a first example of a prior art acceleration sensor.

As shown in FIG. 4, an acceleration sensor 61 has a detecting portion 63 defined in a silicon substrate. The silicon substrate 62 is formed in a rectangular-pillar shape to have a (100) plane. The detecting portion 63 includes a cantilever 65 and a mass (inertial mass) 64 serving as a weight, which are formed integrally at the middle region of the substrate by removing part of the upper and lower surfaces of the silicon substrate 62 with the anisotropic etching. The cantilever 65 extends horizontally from the inner end surface of the substrate 61 that is formed by etching. The cantilever 65 has a surface on which a plurality of dispersion strain gages 66 are arranged. The mass 64 is supported so that the distal end of the cantilever 65 is maintained in a hollow state. When acceleration causes displacement of the mass 64, the cantilever 65 is bent and causes a change in the resistance value of the dispersion strain gages 66. Detection of changes in the resistance value of the dispersion strain gages 66 enables detection of the acceleration.

To manufacture the acceleration sensor 61 of FIG. 4, a silicon substrate 62 (wafer) having a thickness of 200 to 300 microns is normally used. The cantilever 65 must be relatively long and thin to allow the acceleration sensor 61 to have high detecting sensitivity. However, to form such a cantilever 65, it is necessary that the substrate 62 be provided with a relatively large dimension W2. To carry out anisotropic etching on the thick silicone substrate 62, an etching hole having an opening angle corresponding to the (111) plane must be provided. The opening angle necessitates an opening having a relatively large dimension. This increases the size of the substrate 62 and hinders the production of a compact acceleration sensor 61.

SUMMARY OF THE INVENTION

Accordingly, it is an objective of the present invention to provide an optimal method for producing compact sensors.

In one aspect of the present invention, a method for manufacturing a sensor employing a semiconductor includes the steps of (a) applying an n-type silicon layer to the upper surface of a silicon substrate, (b) applying a p-type silicon layer on either the upper surface of the n-type silicon layer or the upper surface of a base, (c) removing part of the p-type silicon layer by performing electrochemical etching, (d) joining the base with the p-type silicon layer applied to the n-type silicon layer or joining the n-type silicon layer with the p-type silicon layer applied to the base, (e) removing the silicon substrate and exposing the upper surface of the n-type silicon layer, and (f) forming a strain gage in a section of the upper surface of the silicon substrate with a portion of the n-type silicon layer facing the upper surface of the base functioning as a diaphragm.

In another aspect of the present invention, a method for manufacturing a sensor employing a semiconductor includes (a) applying an n-type silicon layer to the upper surface of a silicon substrate, (b) applying a p-type silicon layer to the upper surface of the n-type silicon layer, (c) removing part of the p-type silicon layer by electrochemical etching so that the n-type silicon layer has a first portion on which the p-type silicon layer is arranged and a second portion extending integrally from the first portion, (d) joining the p-type silicon layer with a base, (e) removing the silicon substrate and exposing the upper surface of the n-type silicon layer, (f) forming a strain gage in the upper surface of the n-type silicon layer at the second portion, and (g) cutting the base and a portion of the second portion so that the second portion has a free end thus allowing part of the remaining second portion to function as a cantilever.

In a further aspect of the present invention, a method for manufacturing a sensor employing a semiconductor includes the steps of (a) applying an n-type silicon layer to the upper surface of a silicon substrate, (b) applying a p-type silicon layer to the upper surface of the n-type silicon layer, (c) removing part of the p-type silicon layer by electrochemical etching so that the p-type silicon layer is separated into a first p-type portion and a second p-type portion located away from the first p-type portion and so that the n-type silicon layer has a first n-type portion on which the first p-type portion is arranged and a second n-type silicon layer extending integrally from the first n-type portion with the n-type portion having a proximal end and a distal end on which the first p-type portion is arranged, (d) removing part of the upper surface of a base to define a well, (e) joining the first and second p-type portions with the base so that part of the second p-type portion overlaps the well, (f) removing the silicon substrate and exposing the upper surface of the n-type silicon layer, (g) forming a strain gage in the upper surface of the n-type silicon layer at the proximal end of the second n-type portion, and (h) cutting the base and part of the second n-type portion and the second p-type second portion to disengage the joined state of the base and the second p-type portion thus allowing part of the remaining second n-type portion to function as a cantilever and part of the remaining second p-type portion to function as an inertial mass.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

First Embodiment

Figure 5:
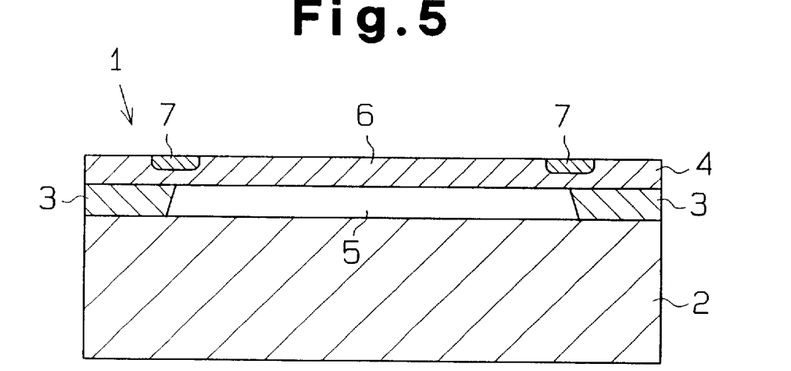
FIG. 5 is a cross-sectional view of a pressure sensor according to a first embodiment of the present invention.

A pressure sensor according to a first embodiment of the present invention will now be described with reference to the drawings. As shown in FIG. 5, a pressure sensor 1 includes a base 2, which is a silicon bulk, a p-type silicon layer 3 and an n-type silicon layer 4. The base 2 has a thickness of about 200 to 300 microns. The p-type silicon layer 3 and the n-type silicon layer 3 have a thickness of 50 microns or less. The base 2 may also be made of a material such as PYREX glass instead of silicon.

The p-type silicon layer 3 is an epitaxial growth layer formed in the shape of a square frame and joined to the surface of the base 2. The square frame-like shape is formed by removing the middle portion of the p-type silicon layer 3 with anisotropic etching. Accordingly, the p-type silicon layer 2 has inner sidewalls that are formed by the anisotropic etching. Furthermore, the surface of the base 2 includes a region joined with the p-type silicon layer 3 and a region that is not joined with the p-type silicon layer 3.

Figure 6:
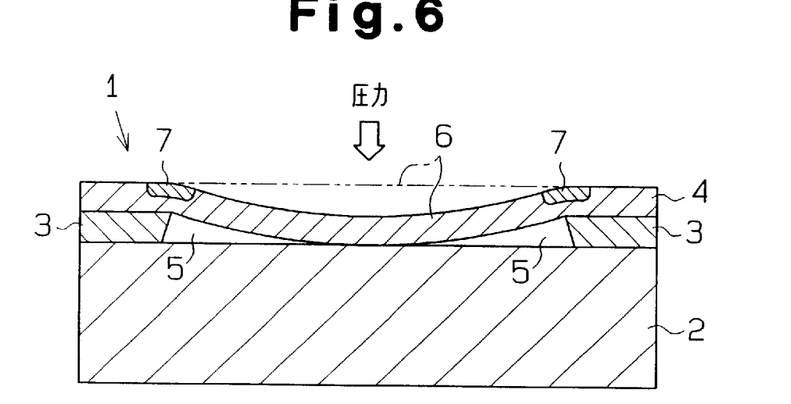
FIG. 6 is a cross-sectional view showing the actuated state of the pressure sensor of FIG. 5.

The n-type silicon layer 4 is an epitaxial growth layer arranged on the p-type silicon layer 3 opposite to the base 2. The n-type silicon layer 4 has an upper surface in which a plurality of dispersion strain gages 7 are formed and a lower surface having a region joined with the p-type silicon layer 3 and a region that is not joined with the p-type silicon layer 3. The non-joining region of the base 2, the inner sidewalls of the p-type silicon layer 3, and the non-joining region of the n-type silicon layer 4 define a reference pressure chamber 5. The reference pressure chamber 5 is under vacuum pressure. Accordingly, as shown in FIG. 6, the middle portion of the n-type layer 4 corresponding with the non-joining region is bent toward the non-joining region of the base 2 by the difference between the external pressure and the pressure of the reference pressure chamber 5. The bending strains the dispersion strain gages 7 and changes their resistance values. Detection of changes in the resistance value enables detection of the pressure. In other words, the middle portion of the n-type silicon layer 4 defines a diaphragm 6 having a pressure receiving surface, and the p-type and n-type silicon layers 3, 4 define a detecting portion. The pressure sensor 1 measures absolute pressure in this manner. Strain gages made by depositing polycrystalline silicon on the upper surface of the n-type silicon layer 4 or bulk strain gages adhered to the top surface of the n-type silicon layers 4 may be employed in lieu of the dispersion strain gages 7.

As a result of anisotropic etching, the inner sidewalls of the p-type silicon layer 3 has a (111) plane. As described in the description of the prior art, the opening angle, which corresponds to the (111) plane of each sidewall, is relatively large. However, since the p-type silicon layer 3 is relatively thin, the width of the opening of the p-type silicon layer 3 formed in accordance with the opening angle is more narrow than that of the prior art. This allows the pressure sensor 1 to have a smaller size compared to that of the prior art.

The p-type silicon layer 3 having a relatively thin layer prevents the diaphragm 6 from being damaged by a relatively large pressure. When a large pressure bends the diaphragm 6, a portion of the diaphragm 6 contacts the non-joining region of the base 2. The contact prevents excessive bending of the diaphragm 6. In other words, the diaphragm 6 does not bend beyond the thickness of the p-type silicon layer 3, and the bending of the diaphragm 6 is restricted by the thickness of the p-type silicon layer 3. Accordingly, alteration of the thickness of the p-type silicon layer 3 enables the range of the detected pressure to be varied. The employment of a relatively thin n-type silicon layer 4 enables the pressure sensor 1 to have a high detecting sensitivity.

The manufacturing steps of the pressure sensor 1 will now be described with reference to the drawings. A plurality of pressure sensors 1 are simultaneously produced on a single wafer. The drawings show the steps for manufacturing a single pressure sensor 1.

Step 1 (refer to FIG. 7A): An epitaxial layer wafer 12 that includes a silicon substrate 11 and p-type and n-type silicon layers 3, 4 is prepared. The wafer 12 has an n-type silicon layer 4 formed by epitaxial growth on the surface of the silicon substrate 11 and a p-type silicon layer 3 formed by epitaxial growth on the n-type silicon layer 4. It is preferable that the n-type silicon layer 4 have a thickness that substantially corresponds to the thickness of the diaphragm 6. Furthermore, it is preferable that the p-type silicon layer 3 have a thickness corresponding to the height of the reference pressure chamber 5. The n-type silicon layers 4, 26 and the p-type silicon layer 3, 24 may be formed by impurity diffusion instead of epitaxial growth.

Figure 7A:
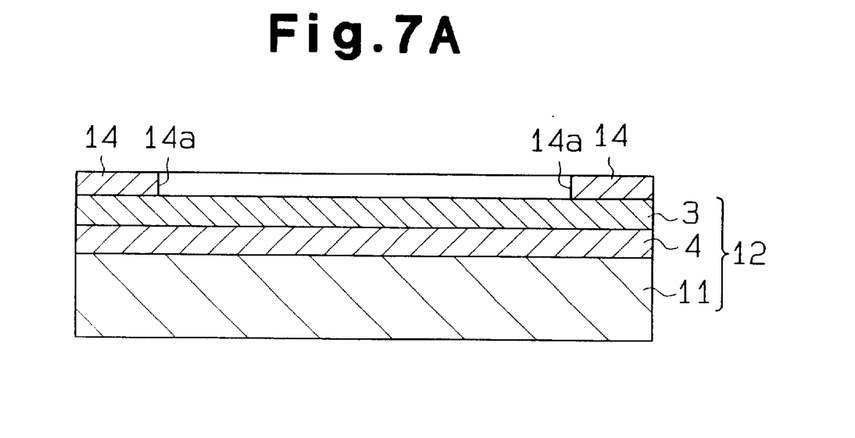
FIGS. 7A–7F are cross-sectional views showing the manufacturing steps of the pressure sensor of the first embodiment.

An etching mask 14 is then formed on the surface of the p-type silicon layer 3. It is preferable that the etching mask be made from an oxide film ($SiO_2$) and silicon nitride (SiN). A window 14a for the reference pressure chamber 5 is formed by undergoing photoetching to remove part of the etching mask 14.

Figure 7B:
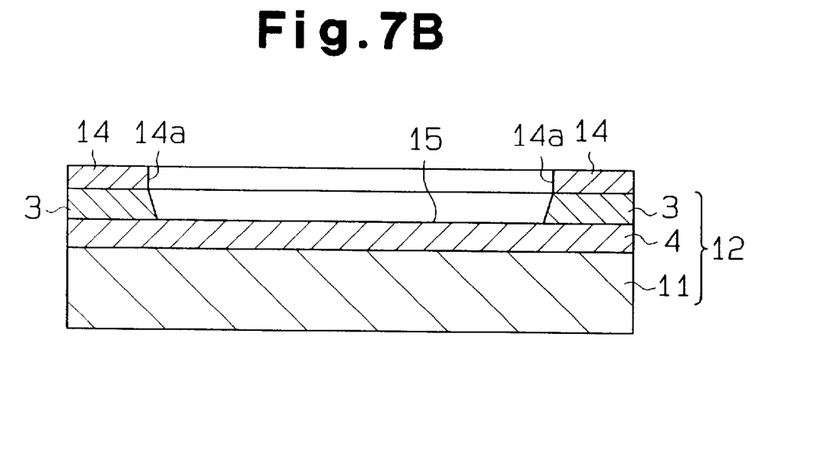

Step 2 (refer to FIG. 7B): A well 15 is formed by removing part of the p-type silicon layer 3, which is exposed through the window 14a, by performing crystal anisotropic etching based on the electrochemical etching stopping method, which employs pn junctions. The well 15 is defined by the sidewalls of the p-type silicon layer 3 that are formed during anisotropic etching and by part of the surface of the n-type silicon layer 4. In the electrochemical etching stopping method, etching is automatically stopped when the surface of the p-type silicon layer 3, which has a (111) plane, and the surface of the n-type silicon layer 4 become exposed. Accordingly, unnecessary portions of the p-type silicon layer 3 are removed. The etching mask 14 is then removed.

Figure 7C:
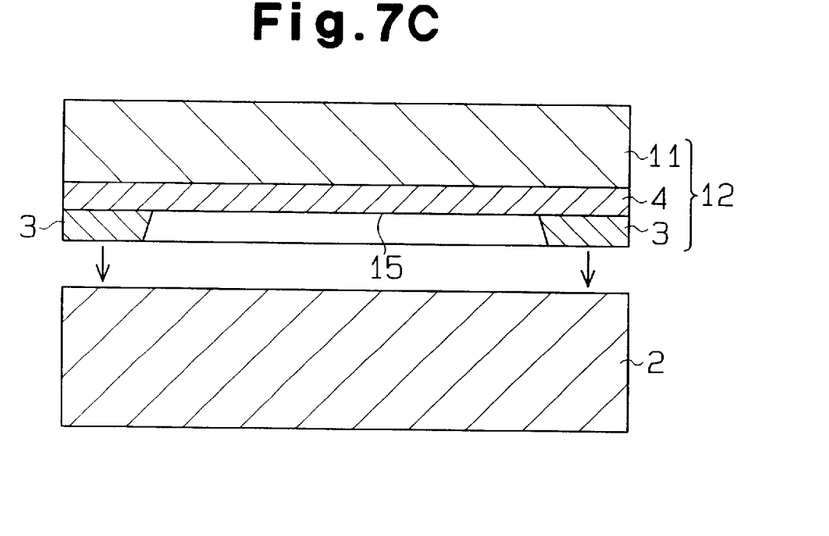

Step 3 (refer to step FIG. 7C): A base 2 having a predetermined thickness is prepared. The epitaxial layer wafer 12 is reversed so that the upper surface of the base 2 faces the upper surface of the p-type silicon layer 3.

Figure 7D:
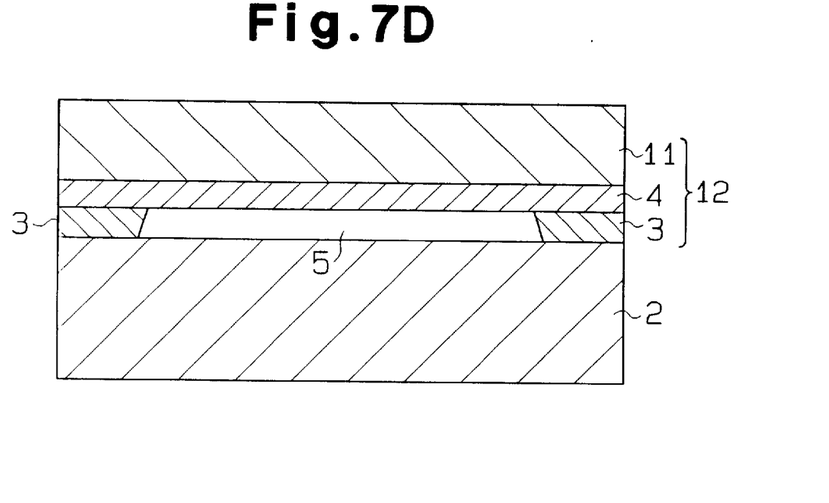

Step 4 (refer to FIG. 7D): The base 2 and the p-type silicon layer 3 are joined together in a vacuum state by employing joining methods such as anode joining or direct joining. The joining defines the reference pressure chamber 5 between the well 15 and part of the surface of the base 2. That is, the reference pressure chamber 5 is defined by the sidewalls having a (111) plane of the p-type silicon layer 3, part of the surface of the n-type silicon layer 4, and part of the surface of the base 2.

Figure 7E:
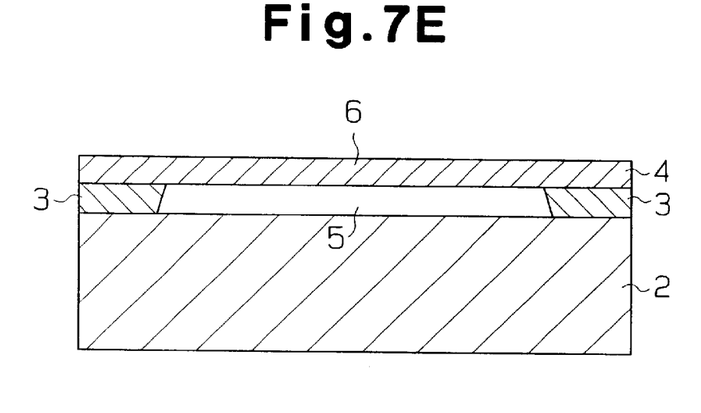

Step 5 (refer to FIG. 7E): The silicon substrate 11 is removed by crystal anisotropic etching based on the electrochemical etching stopping method, which employs pn junctions. This etching is automatically stopped when the surface of the n-type silicone layer 4 on the side of the silicon substrate 11 becomes exposed. Accordingly, only the silicon substrate 11 is positively removed. The silicon substrate 11 may be removed by employing a mechanical grinding method instead of the electrochemical etching method. The n-type silicon layer 4 is then formed so that the thickness corresponds with the thickness of the diaphragm 6 when employing the mechanical grinding method. A wafer having the reference pressure chamber 5 and the diaphragm 6 is produced in this manner.

Figure 7F:
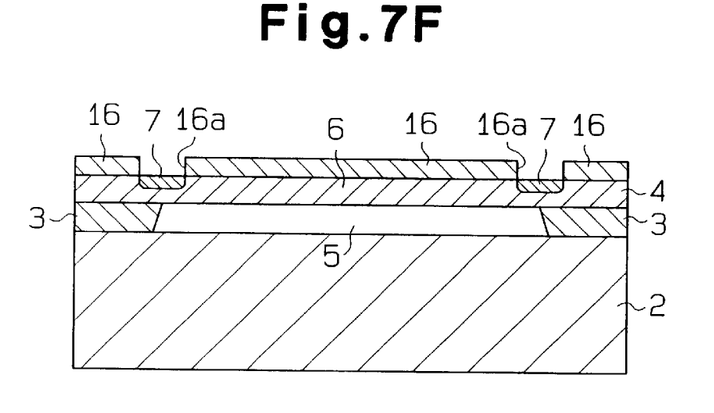

Step 6 (refer to FIG. 7F): A mask 16 made of an oxide film is applied to the surface of the n-type silicon layer 4. Windows 16a, which are used to form the dispersion strain gages 7, are formed by removing part of the mask 16 through photoetching. P-type impurities such as boron ions are injected into part of the surface of the n-type silicon layer 4 that is exposed through the windows 16a. The impurities are then heat diffused. This forms the dispersion strain gages 7. The mask 16 is removed afterward and a wiring pattern (not shown) is formed on the surface of the n-type silicon layer 4. The wiring pattern is formed by sputtering or vacuum depositing aluminum (Al) on the surface of the n-type silicon layer 4 and performing photolithography. A passivation film is then formed on the entire surface of the n-type silicon layer 4. This completes the pressure sensor 1. The passivation film is formed by depositing a SiN film or a $Si_3N_4$ film on the surface of the n-type silicon layer 4 using the CVD method.

In this embodiment, the manufacturing method of the pressure sensor 1 does not include steps in which the etching holes are sealed as in the prior art pressure sensor. Accordingly, the pressure sensor 1, in which the reference pressure chamber 5 is securely maintained in a vacuum state, is easily manufactured.

Second Embodiment

Figure 8:
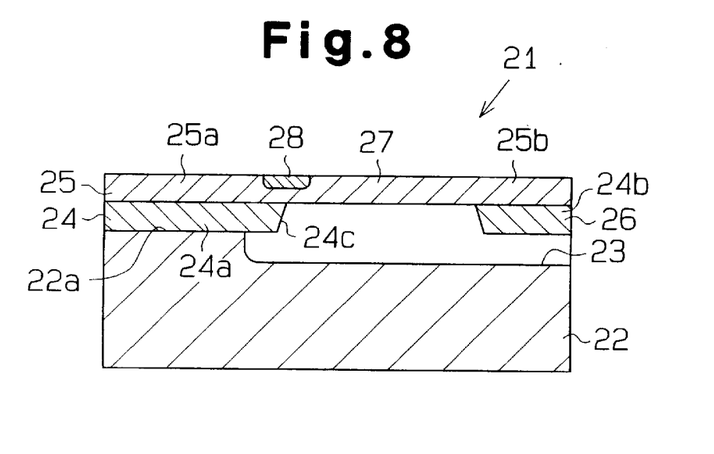
FIG. 8 is a cross-sectional view showing an acceleration sensor according to a second embodiment of the present invention.

An acceleration sensor according to a second embodiment of the present invention will now be described with reference to the drawings. As shown in FIG. 8, the acceleration sensor 21 includes a base 22, which is a silicon bulk, a p-type silicon layer 24, and an n-type silicon layer 25. The p-type silicon layer 24 and the n-type silicon layer 25 have a thickness of 50 microns or less. The base 22 has a well 23 that is formed, for example, by employing isotropic etching.

The base 22 has a thickness of about 200 to 300 microns. The well 23 is provided with a predetermined depth.

The p-type silicon layer 24 is arranged on the surface of the base 22. The area of the p-type silicon layer 24 is about the same as that of the surface 22a of the base 22. More specifically, the p-type silicon layer 24 has a first portion 24a and a second portion 24b, which is spaced away from the first portion 24a. The first and second portions 24a, 24b are formed by removing the part of the p-type silicon layer 24 that corresponds to the well 23 with the anisotropic etching. The first portion 24a has sidewall 24c that are faced toward the well 23. The second portion 24b serves as a mass (inertial mass).

The n-type silicon layer 25 is arranged on the surface of the p-type silicon layer 24 and has substantially the same size as the base 22. More specifically, the n-type silicon layer 25 has a first portion 25a and a second portion 25b, which is formed integrally with the first portion 25a. The first portion 25a has a surface that is applied to the surface of the p-type silicon layer 24. The second portion 25b extends across the well 23 from the sidewall 24c of the first portion 24a. The second portion 25b serves as a cantilever 27 with the second portion 24b, or a distal end portion having mass 26, facing the well 23. The size of the mass 26 is varied by altering the thickness of the p-type silicon layer 24 and by altering the area of the p-type silicon layer 24 that is removed by anisotropic etching. The second portion that defines the cantilever 27, the mass 26, and the first portion 24a of p-type silicon layer 24 constitute a detecting portion.

The acceleration sensor 21 has a dispersion strain gage 28 that is formed in the surface of the n-type silicon layer 25 at the proximal end of the second portion 25b (cantilever 27). The cantilever 27 bends when acceleration displaces the mass 26. The bending changes the resistance value of the dispersion strain gage 28. Detection of changes in the resistance value allows the level of the acceleration to be detected. To obtain an acceleration sensor having high detecting sensitivity, it is preferable that the second portion 25b be relatively thin, that is, it is preferable that the cantilever 27 be bent easily. However, a thin second portion 25b may damage the cantilever 27. In the second embodiment, the mass 26 contacts the well 23 of the base 22 when the cantilever 27 is bent. Accordingly, the bending of the cantilever 27 is restricted even if the acceleration applied to the acceleration sensor 21 is relatively large. In other words, the bending of the cantilever 27 is restricted by the depth of the well 23. This prevents the cantilever 27 from being damaged.

The manufacturing steps of the acceleration sensor 21 will now be described with reference to the drawings. A plurality of acceleration sensors 21 are simultaneously produced on a single wafer. The drawings show the steps for manufacturing a single pressure sensor 1.

Step 1 (refer to FIG. 9A): An epitaxial layer wafer 32 having a silicon substrate 31, an n-type silicon layer 25 arranged on the surface of the silicon substrate 31, and a p-type silicon layer 24 arranged on the surface of the n-type silicon layer 25 is prepared. An etching mask 33 that is made of an oxide film ($SiO_2$) or silicon nitride (SiN) is applied to the surface of the p-type silicon layer 24. A window 33a for the formation of the cantilever 27 is formed by removing part of the mask 33 by employing photoetching.

Figure 9A:
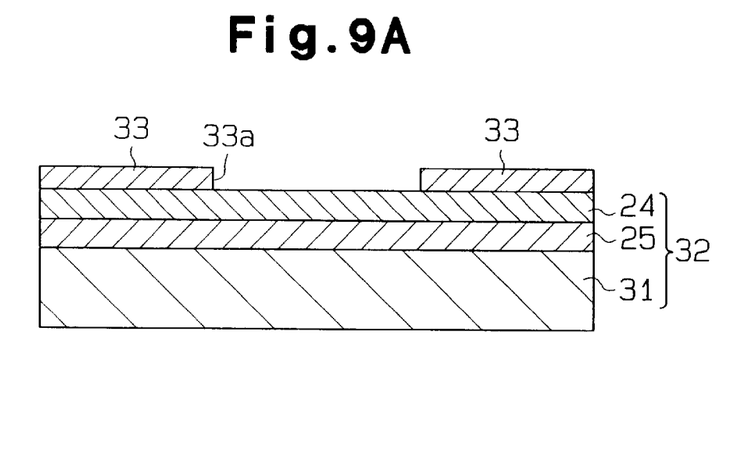
FIGS. 9A to 9F are cross-sectional views showing the manufacturing steps of the acceleration sensor of the second embodiment.

The epitaxial layer wafer 32 has an n-type silicon layer 25 formed by epitaxial growth on the surface of the silicon substrate 31 and a p-type silicon layer 24 formed by epitaxial growth on the n-type silicon layer 25. It is preferable that the n-type silicon layer 25 have a thickness corresponding with the thickness of the cantilever 27. It is preferable that the p-type silicon layer 24 have a thickness corresponding with the thickness of the mass 26.

Figure 9B:
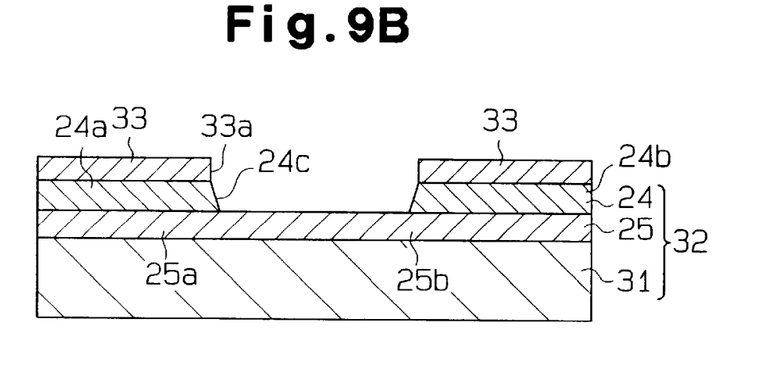

Step 2 (refer to FIG. 9B): Part of the p-type silicon layer 24, which is exposed through the window 33a, is removed by undergoing crystal anisotropic etching based on the electrochemical etching stopping method, which employs pn junctions. The crystal anisotropy divides the p-type silicon layer 24 into the first portion 24a and the second portion 24b, which is used as the mass 26. The n-type silicon layer 25 has a first portion 25a on which the first portion 24a of the p-type silicon layer 24 is arranged and a second portion 25b extending from the sidewall 24c of the first portion 24a. In the electrochemical etching stopping method, etching is automatically stopped when the surface of the p-type silicon layer 24 having the (111) plane and the surface of the n-type silicon layer 25 become exposed. Accordingly, unnecessary portions of the p-type silicon layer 24 is removed. The mask 33 is then etched and removed.

Figure 9C:
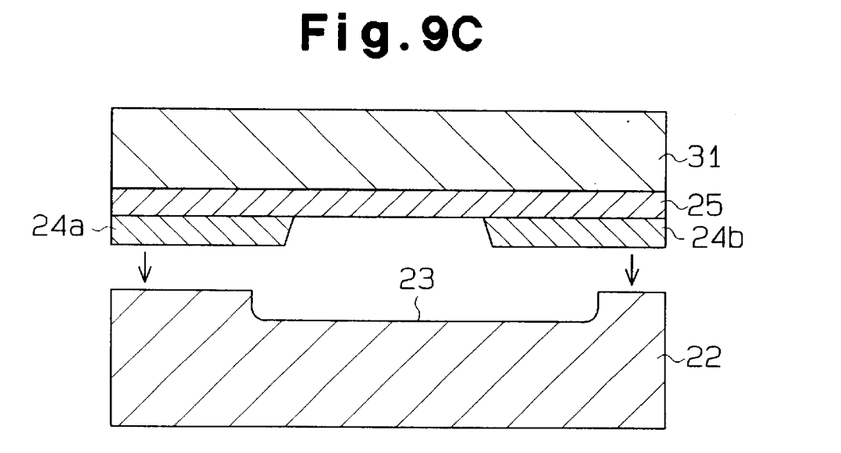

Step 3 (refer to step FIG. 9C): A base 22 having a predetermined thickness is prepared. A mask (not shown) is formed on the surface of the base 22. A window (not shown) is defined in the mask. A well 23 having a predetermined depth is formed on part of the base 22 by performing isotropic etching. The size of the well 23, or the window, is set so that the second portion 24b of the p-type silicon layer 24, which is used as the mass 26, is located above the well 23. The epitaxial layer wafer 32 is then reversed so that the top surface of the base 22 having the wall 23 faces the top surface of the p-type silicon layer 24.

Figure 9D:
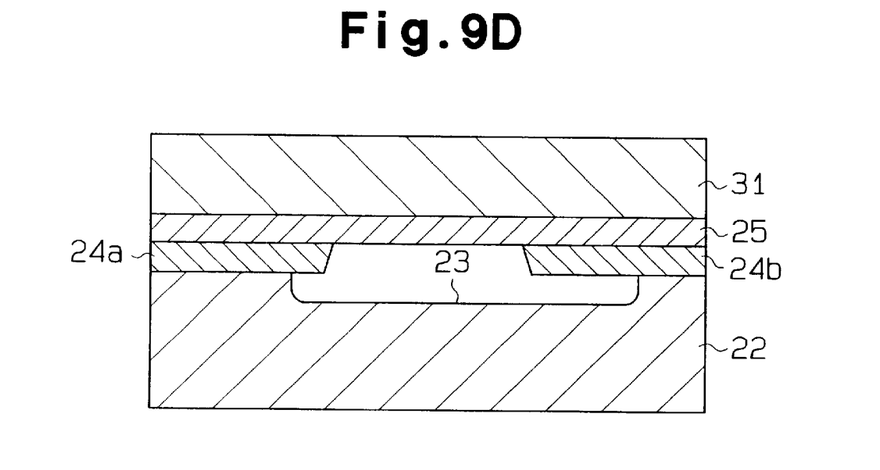

Step 4 (refer to FIG. 9D): The base 22, most of the first portion 24a, and part of the second portion 24b are joined together using joining methods such as anode joining or direct joining. In other words, the first and second portions 24a, 25b are joined with the base 33 so that the part of the second portion 24b overlaps the well 23. The silicon substrate 31 is then removed by crystal anisotropic etching based on the electrochemical etching stopping method, which employs pn junctions. The etching is automatically stopped when the surface of the n-type silicone layer 25 of the silicon substrate 11 becomes exposed. Accordingly, only the silicon substrate 31 of the p-type silicon is positively removed. The n-type silicon layer 25 is then ground to a predetermined thickness (in this case, the thickness of the cantilever 27) by employing a mechanical grinding method. This completes the production of a wafer that includes an n-type silicon layer 25, which thickness corresponds with the cantilever.

Figure 9E:
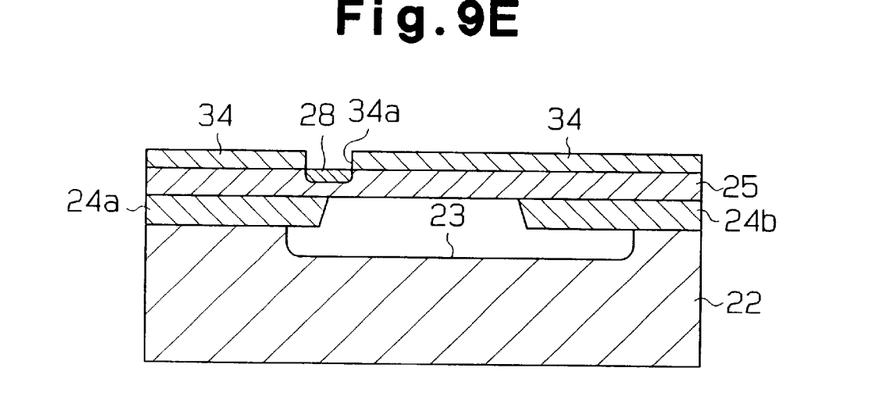

Step 5 (refer to FIG. 9E): A mask 34 made of an oxide film is applied to the surface of the n-type silicon layer 25. A window 34a, which is used to form the dispersion strain gage 28, is formed by performing photoetching to remove part of the mask 34. P-type impurities such as boron ions are injected into the surface of the n-type silicon layer 25 that is exposed through the window 34a. The impurities are heat diffused. This forms the dispersion strain gage 28. The mask 34 is removed afterward. Aluminum (Al) is sputtered or vacuum deposited on the surface of the n-type silicon layer 25. Photolithography is then performed to form a wiring pattern (not shown) on the surface of the n-type silicon layer 25. A passivation film (not shown) is subsequently formed on the entire surface of the n-type silicon layer 25 by depositing a SiN film or a $Si_3N_4$ film on the surface of the n-type silicon layer 25 employing the CVD method.

Figure 9F:
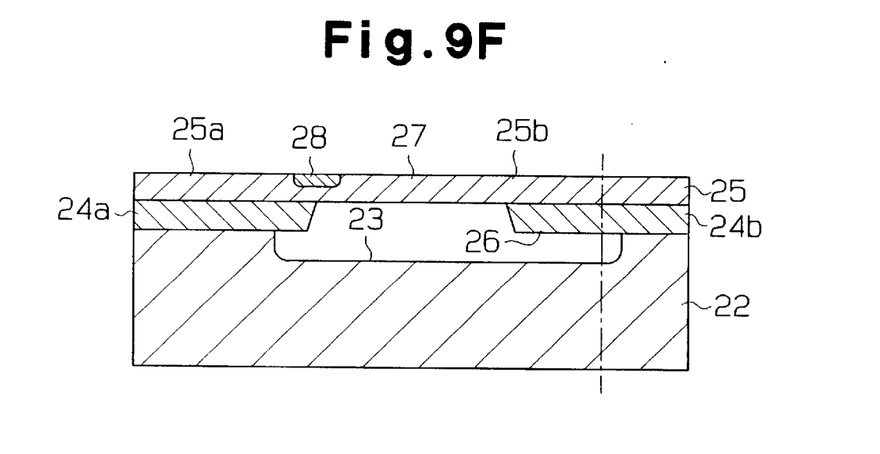

Step 6 (refer to FIG. 9F): The wafer undergoes dicing and is cut along the dotted line as shown in FIG. 9F. The dicing separates the second portion 25b of the n-type silicon layer 25 and the second portion 24b of the p-type silicon layer 24, which functions as a mass, from the base 22. In other words, the second portion 24b is released from the base 22. This results in the second portions 24b, 25b having free ends. The acceleration sensor 21 is produced in this manner with the second portion 25b serving as the cantilever 27 and the second portion 24b serving as the mass 26. The wafer may be cut by a laser instead of undergoing dicing. The n-type silicon layer 25 is relatively thin and thus bends easily. This allows the cantilever 27 to be relatively short. Such cantilever 27 enables production of a more compact acceleration sensor 21.

Although only two embodiments of the present invention have been described so far, it should be apparent to those skilled in the art that the present invention may be embodied in many other specific forms without departing from the spirit or scope of the invention. More particularly, the present invention may be embodied in the modes described below.

Figure 10A:
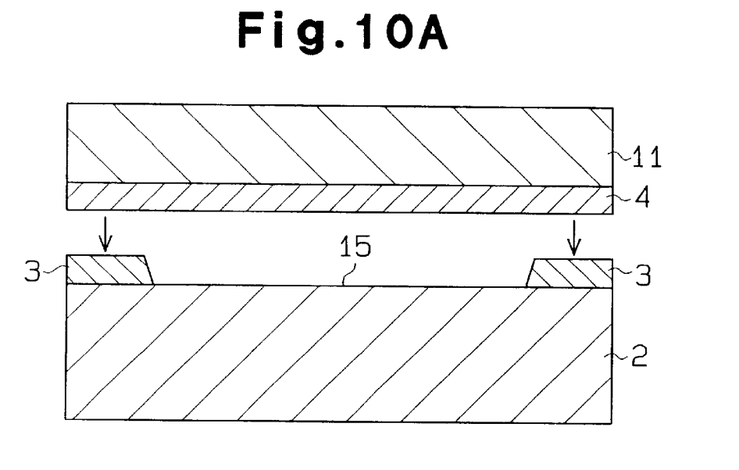
FIGS. 10A and 10B are cross-sectional views showing a further manufacturing method of the pressure sensor according to the first embodiment of the present invention.
Figure 10B:
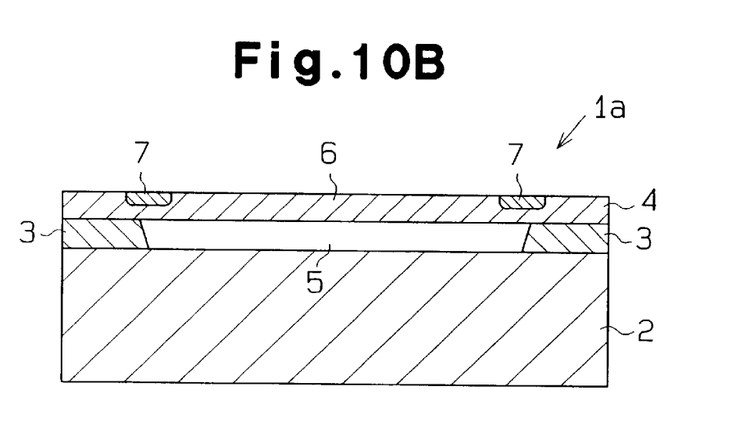

In the first embodiment, the pressure sensor 1a may be manufactured in the manner described in FIGS. 10A and 10B. An epitaxial growth layer wafer that includes a p-type silicon substrate 11 and an n-type silicon layer 4, which is formed on the surface of the substrate 11 by undergoing epitaxial growth, is employed. The p-type silicon layer 3 is formed on the surface of the base 2a, which is made of n-type single crystalline silicon, by epitaxial growth. The p-type silicon substrate 11 is removed after joining the p-type silicon layer 3 and the n-type silicon layer 4. The removal of part of the p-type silicon layer 3 for the formation of the reference pressure chamber 5 is positively performed by undergoing the crystal anisotropic etching based on the electrochemical etching stopping method.

In the first embodiment, the pressure sensor 1 may have a through hole, which is connected with the pressure reference chamber 5 and which extends through the base 2.

Figure 11:
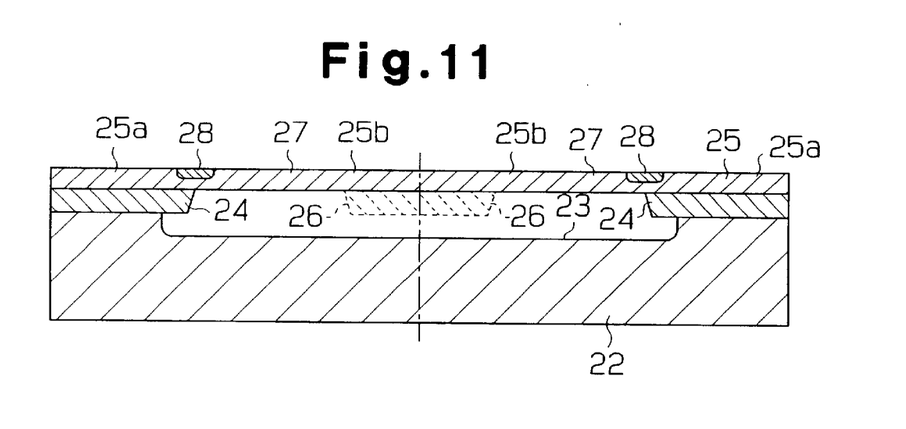
FIG. 11 is a cross-sectional view showing a further manufacturing method of the acceleration sensor according to the second embodiment of the present invention.

As shown in FIG. 11, in the second embodiment, the wafer may undergo dicing to simultaneously produce two acceleration sensors. In other words, the base 22 having the well 23 and the p-type and n-type silicon layers 24, 25 are formed symmetrically about the single-dotted line so as to produce two acceleration sensors. In this case, the second portion 25b of the n-type silicon layer 25, or the mass at the distal end of the cantilever 27, may be eliminated. In other words, the wafer is cut so that the second portions 25b each have free ends.

Therefore, the present examples and embodiments are to be considered as illustrative and not restrictive and the invention is not to be limited to the details given herein, but may be modified within the scope of the appended claims.

What is claimed is:

1. A method for manufacturing a sensor employing a semiconductor, said method comprising the steps of:
   (a) applying an n-type silicon layer to an upper surface of a silicon substrate;
   (b) applying a p-type silicon layer on either the upper surface of said n-type silicon layer or an upper surface of a base;
   (c) removing part of said p-type silicon layer by performing electrochemical etching;
   (d) joining said base with said p-type silicon layer applied to the n-type silicon layer or joining said n-type silicon layer with said p-type silicon layer applied to the base;
   (e) removing said silicon substrate and exposing the upper surface of said n-type silicon layer; and
   (f) forming a strain gage in a section of the upper surface of said silicon substrate, wherein a portion of said n-type silicon layer facing the upper surface of said base functions as a diaphragm.

2. The method according to claim 1, wherein said n-type silicon layer has a lower surface facing the upper surface of said base, wherein the p-type silicon layer has sidewalls that form when the p-type silicon layer is removed, and wherein the rear surface of said n-type silicon layer, the sidewalls of said p-type silicon layer, and the upper surface of said base define a reference pressure chamber.

3. The method according to claim 2, wherein step (d) includes joining said base with said p-type silicon layer applied to the n-type silicon layer or joining said n-type silicon layer with said p-type silicon layer applied to the base in a vacuum state to maintain the pressure of said reference pressure chamber in a vacuum state.

4. The method according to claim 1, wherein said steps (a) and (b) is replaced with a step of preparing a silicon substrate having an n-type silicon layer applied to the upper surface of the silicon substrate and a p-type silicon layer applied to the upper surface of said n-type silicon layer.

5. The method according to claim 4, wherein said n-type silicon layer is formed by epitaxial growth on the upper surface of said silicon substrate, and wherein said p-type silicon layer is formed by epitaxial growth on the upper surface of said n-type silicon layer.

6. The method according to claim 1, wherein said step (a) is replaced with a step of preparing a silicon substrate having an n-type silicon layer applied to the upper surface of the silicon substrate, and said step (b) includes a step of applying a p-type silicon layer to the upper surface of a base made of n-type silicon.

7. The method according to claim 6, wherein said n-type silicon layer is formed by epitaxial growth on the upper surface of said silicon substrate, and wherein said p-type silicon layer is formed by epitaxial growth on the upper surface of said base.

8. The method according to claim 1, wherein said sensor is a pressure sensor.

9. A method for manufacturing a sensor employing a semiconductor, said method comprising the steps of:
   (a) applying an n-type silicon layer to an upper surface of a silicon substrate;
   (b) applying a p-type silicon layer to the upper surface of said n-type silicon layer;
   (c) removing part of said p-type silicon layer by electrochemical etching so that the n-type silicon layer has a first portion on which the p-type silicon layer is arranged and a second portion extending integrally from said first portion;
   (d) joining said p-type silicon layer with a base;
   (e) removing said silicon substrate to expose the upper surface of said n-type silicon layer;
   (f) forming a strain gage in said upper surface of the n-type silicon layer at said second portion; and
   (g) cutting said base and a portion of said second portion so that said second portion has a free end thus allowing part of the remaining second portion to function as a cantilever.

10. The method according to claim 9 further comprising a step (h) of removing part of the upper surface of the base to define a well after said step (c) and before said step (d), and wherein said step (d) includes joining said p-type silicon layer with said base so that said second portion overlaps said well.

11. The method according to claim 9, wherein said steps (a) and (b) are replaced with a step of preparing a silicon substrate having an n-type silicon layer applied to the upper surface of the silicon substrate and a p-type silicon layer applied to the upper surface of said n-type silicon layer.

12. The method according to claim 11, wherein said n-type silicon layer is formed by epitaxial growth on the upper surface of said silicon substrate, and wherein said p-type silicon layer is formed by epitaxial growth on the upper surface of said n-type silicon layer.

13. The method according to claim 9, wherein said sensor is an acceleration sensor.

14. A method for manufacturing a sensor employing a semiconductor, said method comprising the steps of:

(a) applying an n-type silicon layer to an upper surface of a silicon substrate;

(b) applying a p-type silicon layer to the upper surface of said n-type silicon layer;

(c) removing part of said p-type silicon layer by electro-chemical etching so that said p-type silicon layer is separated into a first p-type portion and a second p-type portion located away from the first p-type portion and so that said n-type silicon layer has a first n-type portion on which said first p-type portion is arranged and a second n-type silicon layer extending integrally from said first n-type portion, wherein said n-type portion has a proximal end and a distal end on which the first p-type portion is arranged;

(d) removing part of an upper surface of a base to define a well;

(e) joining said first and second p-type portions with said base so that part of said second p-type portion overlaps said well;

(f) removing said silicon substrate to expose the upper surface of said n-type silicon layer;

(g) forming a strain gage in said upper surface of the n-type silicon layer at the proximal end of said second n-type portion; and (h) cutting said base and part of said second n-type portion and said second p-type second portion to disengage the joined state of said base and said second p-type portion thus allowing part of the remaining second n-type portion to function as a cantilever and part of the remaining second p-type portion to function as an inertial mass.

15. The method according to claim 14, wherein said steps (a) and (b) are replaced with a step of preparing a silicon substrate having an n-type silicon layer applied to the upper surface of the silicon substrate and a p-type silicon layer applied to the upper surface of said n-type silicon layer.

16. The method according to claim 15, wherein said n-type silicon layer is formed by epitaxial growth on the upper surface of said silicon substrate, and wherein said p-type silicon layer is formed by epitaxial growth on the upper surface of said n-type silicon layer.

17. The method according to claim 14, wherein said sensor is an acceleration sensor.

* * * * *